United States Patent [19]

Tojo et al.

[11] Patent Number: 4,572,956
[45] Date of Patent: Feb. 25, 1986

[54] ELECTRON BEAM PATTERN TRANSFER SYSTEM HAVING AN AUTOFOCUSING MECHANISM

[75] Inventors: Toru Tojo, Yamato; Ichiro Mori, Tokyo; Toshiaki Shinozaki, Yokohama; Kazuyoshi Sugihara, Kawasaki; Mitsuo Tabata, Yokohama; Chikara Itoh, Tokyo, all of Japan

[73] Assignee: Tokyo Shibaura Denki Kabushiki Kaisha, Kawasaki, Japan

[21] Appl. No.: 525,419

[22] Filed: Aug. 22, 1983

[30] Foreign Application Priority Data

Aug. 31, 1982 [JP] Japan ................. 57-150928
Dec. 22, 1982 [JP] Japan ................. 57-223980

[51] Int. Cl.$^4$ ........................................... H01J 37/30
[52] U.S. Cl. ................................................. 250/492.2
[58] Field of Search ................. 250/492.2, 396, 398, 250/400, 491.1, 492.3

[56] References Cited

U.S. PATENT DOCUMENTS

| | | | |
|---|---|---|---|
| 3,551,734 | 12/1970 | O'Keeffe | 315/31 |
| 3,843,916 | 10/1974 | Trotel et al. | 250/492.2 |
| 3,983,401 | 9/1976 | Livesay | 250/492.2 |
| 4,008,402 | 2/1977 | O'Keeffe | 250/492.2 |
| 4,469,949 | 9/1984 | Mori et al. | 250/492.2 |

FOREIGN PATENT DOCUMENTS 47-12064 4/1972 Japan .
2055195 2/1981 United Kingdom .

OTHER PUBLICATIONS

Philips Technical Review, vol. 37, No. 11/12, 1977, pp. 347-356, Eindhoven, NL; J. P. Scott: "Electron-Image Projector".

Patents Abstracts of Japan, vol. 5, No. 59(E-53)(731), Apr. 22, 1981; & JP A 56 10927 (Cho Lsi Gijutsu Kenkyu Kumiai), 03-02-1981.

R. Ward; Developments in Electron Image Projection; J. Vac. Sci. Technol., 16 (6), Nov./Dec. 1979.

Primary Examiner—Bruce C. Anderson
Assistant Examiner—Paul A. Guss
Attorney, Agent, or Firm—Oblon, Fisher, Spivak, McClelland & Maier

[57] ABSTRACT

An electron beam pattern transfer system is disclosed which includes a photoelectric transducing mask disposed within a vacuum container and adapted to transfer a photoelectron beam pattern corresponding to a pattern of the mask onto a sample according to an amount of an incident light, a DC voltage generator connected to vary a voltage applied between the mask and the sample, and a focusing coil of a superconductive magnet for creating a magnetic field of a predetermined intensity between the mask and the sample. When a mask-to-sample distance and/or magnetic field intensity varies undesirably, the variation is electrically detected by detectors. In order to compensate for the defocusing of the photoelectron beam pattern on the sample due to the above-mentioned variation, a microprocessor automatically calculates an amount of correction with respect to the intensity of the electric field between the mask and the sample, on a real-time basis and supplies its control signal to the DC voltage generator.

18 Claims, 7 Drawing Figures

U.S. Patent Feb. 25, 1986 Sheet 3 of 4 4,572,956
F I G. 3
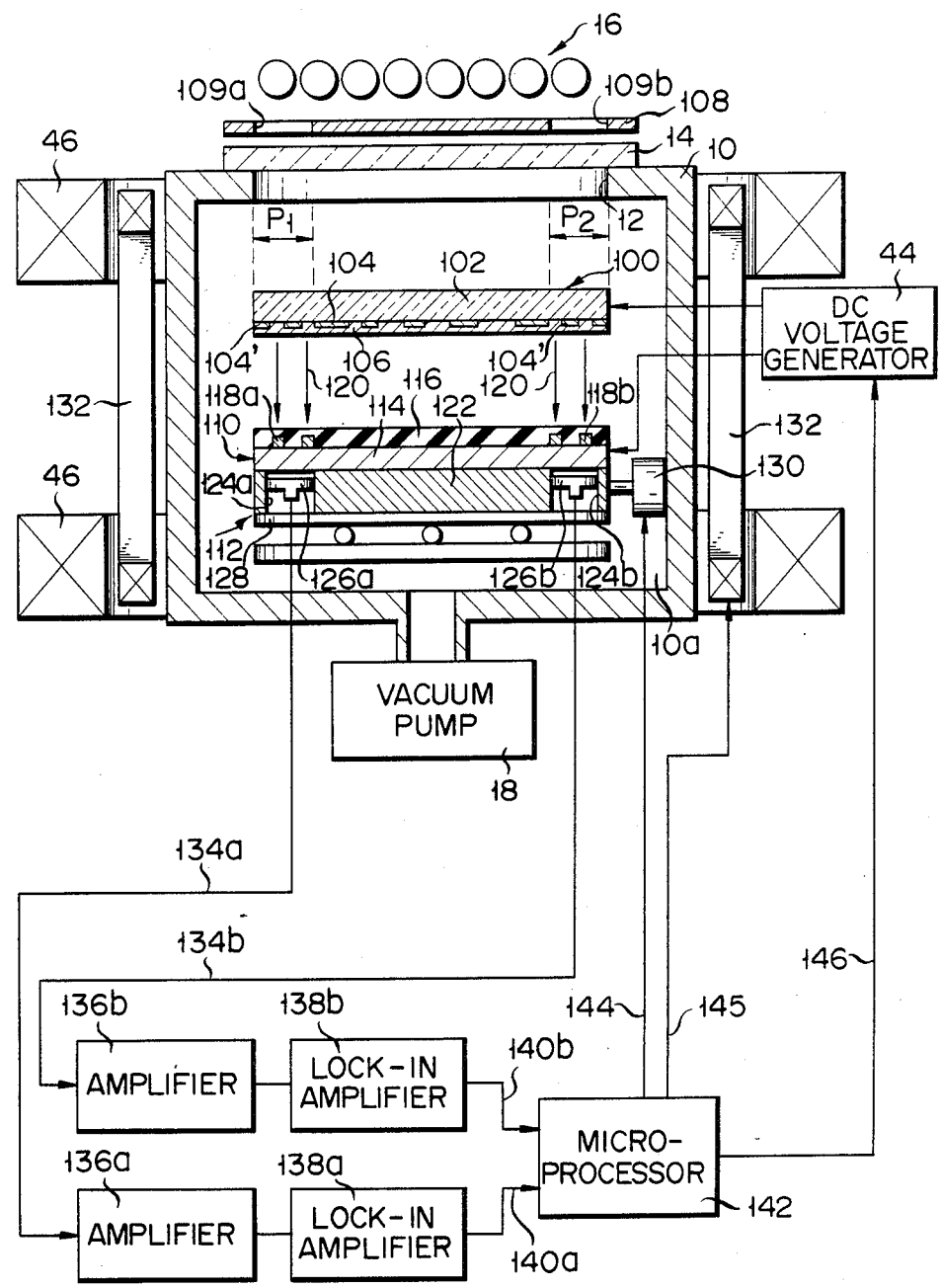

ELECTRON BEAM PATTERN TRANSFER SYSTEM HAVING AN AUTOFOCUSING MECHANISM

BACKGROUND OF THE INVENTION

This invention relates to an electron beam pattern transfer system using a photoelectric transducing mask.

It has been impossible heretofore to increase the packing density of semiconductor devices, even by employing currently available fine patterning techniques (e.g., photolithography), due to the dimensional limits of a pattern resulting from the wavelength of light used. Consequently, there has been a great demand for the development of an even finer patterning technique, such as a submicron patterning technique.

A pattern transfer system utilizing an X-ray or an electron beam instead of a light beam shows promise as a new ultrafine patterning technique. According to the electron beam pattern transfer system, an ultraviolet ray is directed onto a photoelectrical transducing mask which is positioned parallel to a substrate such as a semiconductor wafer and under uniform, strong electric and magnetic fields created between the mask and the substrate a photoelectron beam pattern is focused onto a resist film on the wafer so as to transfer a mask pattern onto the resist film on the wafer. This system permits the transfer of an ultra-fine pattern onto a submicron area. The patterning technique of this kind has various advantages including, for example, the following: (1) a high-speed pattern transfer can be carried out with a high yield; and (2) since the mask is similar in structure to a photomask, the conventional technique can be used in the fabrication of the mask structure.

On the other hand, this electron beam pattern transfer system involves the following problem with respect to the wafer alignment technique. When the photoelectron beam pattern emitted from the photoelectric surface of the mask is focused onto a silicon wafer, and an acceleration voltage V is applied between the mask and the wafer, focusing magnetic field intensity B and mask-to-wafer distance d are important parameters. In order to obtain a high image resolution characteristic, it is necessary to reduce the edge blur of the photoelectron beam pattern on the wafer to a minimum. For example, in order to control the edge resolution of the electron beam pattern down to below 0.1 μm, a deviation of the applied voltage V from a set value should be reduced to below 0.02% and a variation in the focusing magnetic field intensity B should be reduced to below 0.01%. It is also necessary to reduce a variation in the mask-to-wafer distance d to a very small value. However, there is a high probability that the above-mentioned distance d will vary undesirably due to, for example, the replacement of the silicon wafer (sample), the replacement of the mask, and the accuracy with which a table having the wafer placed thereon is mechanically moved. Even if the accuracy of the applied voltage V and magnetic field intensity B can be enhanced, the edge blur of the electron beam pattern is increased due to inaccurate setting of the mask-to-wafer distance d, resulting in a lowered image resolution. It is therefore difficult in the prior art technique to focus the photoelectron beam pattern onto the wafer with high accuracy by effectively adjusting the above-mentioned three important parameters: the applied voltage V, magnetic field intensity B and distance d.

In the prior art technique, for example, in order to focus an electron beam pattern onto the wafer, a pattern transfer is initially carried out and the applied voltage V and magnetic field intensity B are adjusted, while observing the transferred pattern image, to obtain an optical requirement. It is therefore impossible to adequately compensate for a variation in the mask-to-wafer distance. Furthermore, a great deal of time is required for focusing the electron beam pattern onto the wafer, thus lowering the rate of operation. It is also impossible to detect and compensate for any defocusing which may occur after focusing has been carried out. This leads to the problem of low yield in the pattern transfer operation.

SUMMARY OF THE INVENTION

It is accordingly the object of this invention to provide a new and improved electron beam transfer system which can properly and automatically adjust the focusing of an electron beam pattern onto a target body (sample) such as a resist film on a substrate and can transfer the pattern to the resist film with high image resolution.

In order to attain the above-mentioned object, according to this invention a variation in a distance between a photoelectrical transducing mask and a target body onto which an electron beam pattern corresponding to a mask pattern is directed, and/or a variation in the intensity of a magnetic field created between the target body and the mask is quantitatively detected. The focusing mechanism automatically eliminates any amount of defocusing which occurs due to variations in the above-mentioned parameters by correcting the intensity of an electric field which is created between the mask and the target body. That is, the focusing mechanism automatically detects the variation in the parameters and calculates the necessary amount of correction of the electric field intensity to compensate for the detected amount of variation, on a real-time basis. A voltage generator permits a mask-to-target body voltage to vary in response to a signal corresponding to a calculated amount.

BRIEF DESCRIPTION OF THE DRAWINGS

This invention is best understood by reference to the accompanying drawings, in which:

FIG. 3 is a block diagram schematically showing a whole structure of an electron beam pattern transfer system according to another embodiment of this invention;

DETAILED DESCRIPTION OF THE PREFERRED EMBODIMENT

Figure 1:
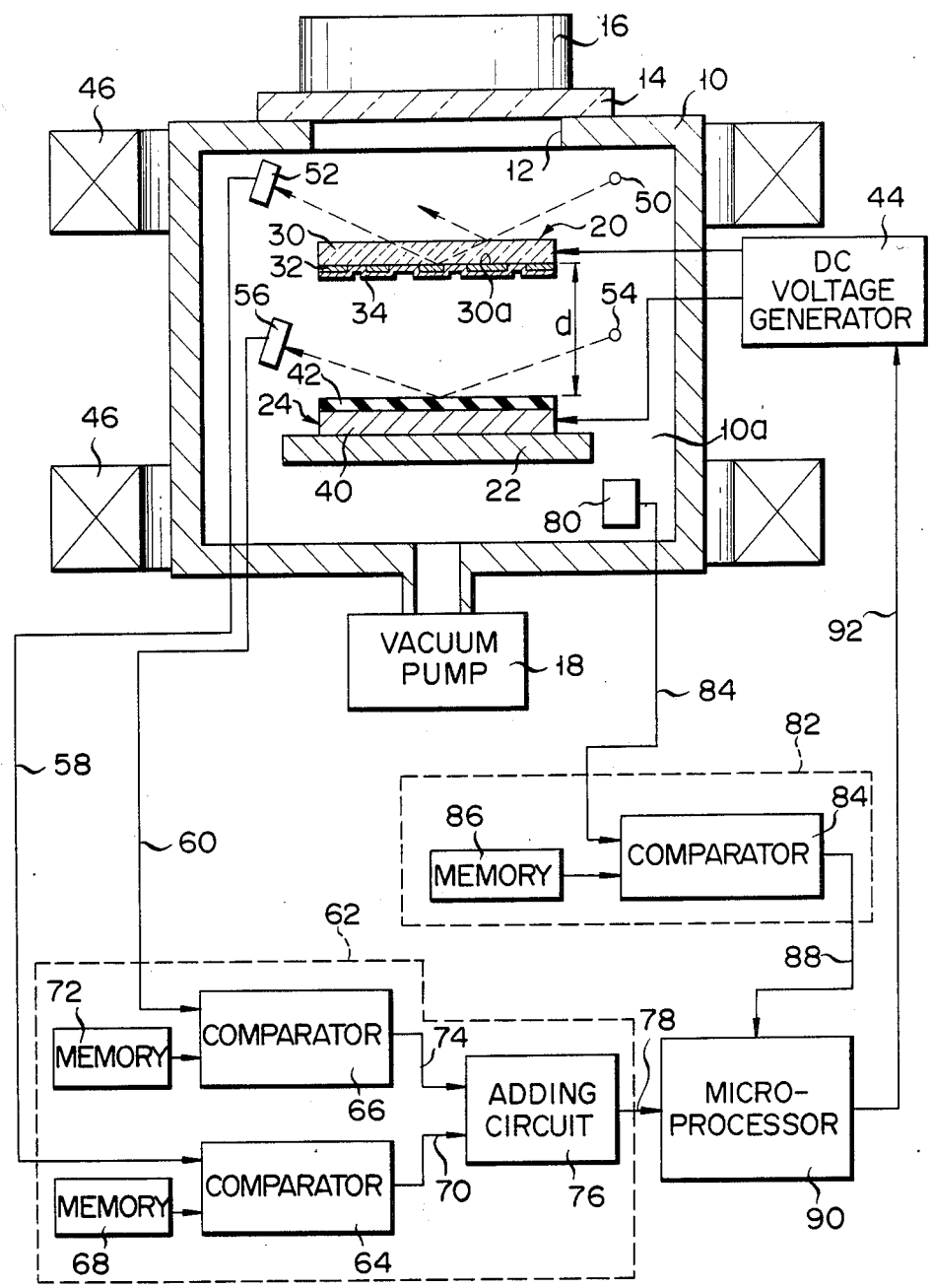
FIG. 1 is a block diagram schematically showing a whole structure of an electron beam pattern transfer system according to a preferred embodiment of this invention.

FIG. 1 shows an electron beam pattern transfer system according to one embodiment of this invention. A cylindrical container 10 has an opening 12 at the top wall. The opening 12 is hermetically closed by a plate 14 made of a material, such as quartz, which permits the passage of an ultraviolet ray emitted from an external light source 16. The container 10 is coupled at its bottom to a vacuum pump 18 to evacuate an inner space, i.e., a transfer chamber 10a in the container 10, to a vacuum level of, for example, $10^{-6}$ Torr. Within the container 10, a mask 20 is located substantially parallel to and at a reference distance of, for example, 10 mm from a table 22 and in the axial direction of the container 10. A target body or sample 24 made of a substrative body, such as a silicon wafer or a glass (quartz) substrate, is placed on the table 22.

Figure 2:
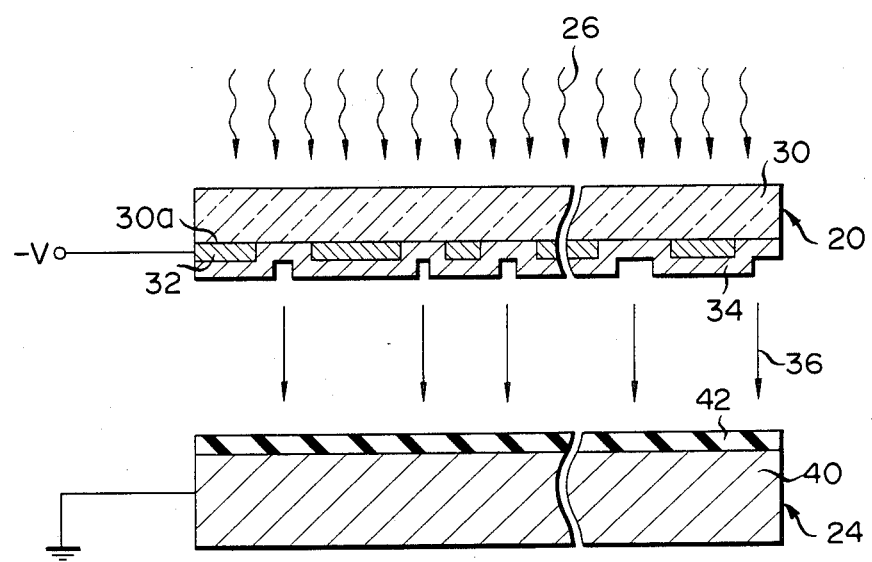
FIG. 2 is a partially enlarged view showing a photoelectric transducing mask and a sample, i.e., a silicon wafer with a photoresist film, which are placed in a vacuum transfer chamber of the electron beam pattern transfer system of FIG. 1.

As shown more clearly in FIG. 2, the mask 20 comprises a glass substrate 30 for permitting the effective passage of ultraviolet rays 26 radiated from the light source 16 (FIG. 1), a mask pattern layer 32 formed in a desired pattern on the transparent substrate 30 and made of an ultraviolet-absorbing material, and a photoelectric layer 34 deposited on the substrate 30 and mask pattern layer 32 and made of CsI to permit a photoelectron beam 36 to be emitted in a manner corresponding to the ultraviolet rays 26 entering the photoelectric layer 34 through the substrate 30. The photoelectric layer 34 faces the sample (target body) 24 illuminated with ultraviolet rays 26 emitted from the source 16 and transmitted through the transparent substrate 30, that light portion incident on the mask pattern layer 32 is absorbed therein. The photoelectron beam 36 emitted from the layer 30 of the mask 20 forms an electron beam pattern corresponding to the configuration of a mask pattern and is directed onto the sample 24 on the table 22 within the vacuum container 10.

The sample 24 may be a monocrystalline silicon wafer 40 on which an electron-sensitive resist film 42 is formed. This film 42 is made of, for example, polymethyl methacrylate (PMMA). The electron beam pattern 36 from the mask 20 is directed onto the electron-sensitive resist film 42 on the wafer 40 to permit the film 42 to be exposed. Between the mask 20 and the sample 24 the electron beam pattern 36 is accelerated and focused by both an electric and a magnetic field. The electric field is created by applying a high DC voltage of, for example, about 20 KV between the mask 20 and the sample 24. The DC voltage is developed by an external DC voltage generator 44. When the voltage is applied, the mask 20 is held at a negative voltage $-V$ (V=20 KV, for example) level with the wafer 40 grounded as shown in FIG. 2. The magnetic field is created by a pair of ring coils 46 between the mask 20 and the sample 24. The coils 46 are immovably mounted around the external peripheral wall of the vacuum container 10. Within the transfer chamber 10a, a uniform vertical field is created from the mask 20 toward the sample 24. Since in this embodiment the acceleration voltage is set to 20 KV, a superconductive magnet is preferably utilized as a focusing coil 46 to stably and uniformly create a strong magnetic field having an intensity corresponding to the electric field intensity at this time. The superconductive magnet can produce a strong magnetic field since it permits the ready flow of a large current. It can also realize better uniformity of magnetic field by a simple magnet arrangement of a Helmholtz type, because it permits larger ring coil arrangement. By using a permanent current mode, i.e., a characteristic of the superconductive magnet, a magnetic field substantially free from any unstable factors, such as drift or ripple, can be formed between the mask 20 and the sample 24.

The electron beam pattern 36 emitted from the mask 20 is focused onto the electron-sensitive resist film 42 on the wafer by the electric and magnetic fields created by the voltage generator 44 and superconductive magnet focusing coil 46. As a result, the electron-sensitive resist film 42 is exposed with the electron beam pattern 36 so that the mask pattern of the mask 20 is transferred to the sample 24. In order to correctly focus the electron beam pattern onto the sample 24 with the best possible resolution, the relation among (i) a mask-to-sample distance d, (ii) the intensity of a magnetic field B, and (iii) a voltage V applied between the mask and the sample and defining the intensity of an electric field is properly determined by Equation (1) below:

$$B = \pi \sqrt{\frac{2m}{e}} \cdot \frac{\sqrt{V}}{d} \tag{1}$$

where m: the mass of the electron, e: the charge of the electron.

According to this embodiment, a reference distance $d_0$ between the mask and the sample was determined to be 10 mm and a reference voltage $V_0$ applied between the mask and the sample was set to 20 KV in the initial design as described above. Thus, a reference focusing magnetic field intensity $B_0$ was determined to be 1.4 KG.

The electron beam pattern transfer system of this invention includes an automatic focus-correcting mechanism, which will be described below.

In order to measure the actual distance d between the mask 20 and the sample 24 on the table 22, an optical distance measuring device is set within the vacuum transfer chamber 10a. The distance measuring device is comprised of a light emitting element 50 and light receiving element 52 for measuring the actual position of the mask 20, and a light emitting element 54 and light receiving element 56 for measuring the actual position of the sample 24. The pair of these elements 50, 52 are arranged such that, in order to accurately detect the position of the mask pattern layer 32 on the transparent substrate 30, the element 52 is adapted to receive the light beam components which are reflected at the junction face 30a between the substrate 30 and the mask pattern layer 32 after light is emitted from the element 50. Electrical detection signals 58 and 60 representing the actual mask position and sample position, respectively, are produced from the elements 52 and 56. The detection signals 58 and 60 are supplied to first and second comparators 64 and 66 by a distance error detector 62. The first comparator 64 is adapted to detect a deviation from an initially set reference position and has a first input terminal connected to a memory 68, such as a ROM, provided in the detector 62 to store the reference position data of the mask and a second input terminal for receiving the detection signal 58. The comparator 64 compares the signal 58 and the reference position data from the memory 68 to produce a comparison result signal 70 corresponding to the difference ($\Delta d_1$) therebetween. The signal 70 contains a sign (plus or minus) representing the magnitude between the actual position data, which are represented by the signal 58, and reference position data. The second comparator 66 is adapted to detect a deviation from an initially set reference position of the mask (in this connection it is evident that the above-mentioned reference distance $d_0$ is defined by the reference positions of the mask 20 and sample 24), and has a first input terminal connected to a memory 72 provided in the detector 62 to store the reference position data from the memory 72 and a second input terminal for receiving the detection signal 60. The comparator 66 compares the signal 60 with the data from the memory 72 to produce a comparison result signal 74 corresponding to the difference ($\Delta d_2$) under the same name as that in the first comparator 64. The first and second comparators 64 and 66 have their output terminals connected to an adding circuit 76 in the detector 62. The adding circuit 76 is adapted to additively process the distance deviation data $\Delta d_1$ and $\Delta d_2$ from the comparators 64 and 66 to produce addition result data as an electrical signal 78 which represents a deviation of the actual mask-to-sample distance d from the reference distance $d_0$.

A magnetic field intensity measuring system, such as a Hall element 80, is hermetically sealed within the transfer chamber 10a of the vacuum container 10 to measure the actual intensity of the magnetic field B, which is created by the superconductive magnet coils 46 within the transfer chamber 10a. The Hall element 80 is adapted to supply an electrical signal 84 representing the actual intensity of the magnetic field within the transfer chamber 10a to a magnetic field intensity error detector 82. The detector 82 includes a memory 86 for storing the reference magnetic field intensity data $B_0$ and a comparator (third comparator) 84 having a first input terminal connected to the memory 86 and a second input terminal to which the signal 84 representing the actual magnetic field intensity B is supplied from the Hall element 80. The comparator 84 delivers, as a magnetic field intensity error $\Delta B$, a comparison result signal 88 corresponding to difference data between the input signals of the memory 86 and Hall element 80. The error signals 78 and 88 of the circuits 62 and 82 are conveyed to a control unit 90 having a microprocessor. The microprocessor 90 produces a control signal 92 according to the mask-to-sample distance error data $\Delta d$ ($=\Delta d_1 + \Delta d_2$) and magnetic field intensity error data $\Delta B$ to correct the reference voltage $V_0$ to be applied between the mask and the sample. In order to correct the defocusing of the electron beam on the sample due to the error data $\Delta d$ and $\Delta B$ and thus to correctly focus the electron beam pattern onto the sample 24, a voltage V is calculated based on the following equation and calculation result data is supplied, as the control signal 92, to the DC voltage generator 44.

$$V = k \frac{e}{2m\pi} \cdot B^2 \cdot d^2 \left(1 + \frac{2\Delta B}{B}\right) \left(1 + \frac{2\Delta d}{d}\right) \tag{2}$$

where k is a constant.

The DC voltage generator 44 permits its output voltage to vary in response to the signal 92. Thus, the voltage applied between the mask 20 and the sample 24 is corrected by an amount $\Delta V$. Consequently, the mask-to-sample voltage varies in proportion to the corrected voltage, permitting focusing the electron beam pattern onto the sample 24.

In accordance with the electron beam transfer system thus arranged, even if a deviation of the mask-to-sample distance d from the reference setting value $d_0$ and/or a deviation of the mask-to-sample magnetic field intensity from the reference setting value $B_0$ is produced during the actual pattern transfer period, the mask-to-sample voltage V is corrected and thus the electron beam pattern from the mask is accurately focused onto the sample 24, causing the electron beam pattern to be transferred onto the sample with a high image resolution. In order to compensate for the variation of the distance d and/or the magnetic field intensity B, the correction of the mask-to-sample voltage applied can be effected using real-time processing without a delay. As a result, the pattern transfer operation can be effectively performed, while always maintaining a good image resolution, and a high yield can be obtained in the pattern transfer operation. In the electron beam transfer system, if the mask 20 or the sample 24 (i.e., the silicon wafer 40 with the resist film 42) is replaced by, for example, another material, there is a high risk that the actual mask-to-sample distance d will vary. One correction method may be considered which mechanically adjusts the height of the table 22 so as to adjust the variation of this distance on the order of a micron unit. However, such mechanical method is still inadequate. According to the system of FIG. 1, the variation or deviation of the mask-to-sample distance is electrically detected by the optical detecting means (50, 52, 54, 56) and detector 62 and an error compensation processing is carried out by the microprocessor 90 on a real-time basis. The voltage generator 44 corrects the output voltage applied between the mask 20 and the sample 24 in response to the control signal 92 from the microprocessor 90. Since the mask-to-sample electric field intensity B is properly corrected, the defocusing of the electron beam resulting from the error components of the distance d can be corrected on a real-time basis.

According to the electron beam pattern transfer system of this invention, the superconductive magnet coil used as the focusing magnet 46 is driven in a permanent current mode, preventing a variation in the magnetic field created due to a variation of a power source voltage level and/or the application of ripple components to obtain a stable, uniform magnetic field. However, the current flowing through the superconductive magnet coil 46 will be unavoidably decreased due to long term usage. It is generally necessary that, in order to correct the defocusing of the electron beam on the sample 24 due to a decrease in the magnetic field intensity resulting from the decrease in the current, the permanent current mode of the superconductive magnet coil 46 must be interrupted once and a normal current must used instead. However, the current-adjusting operation of the superconductive magnet coil 46 is very cumbersome and time-consuming. According to this invention, the defocusing of the electron beam due to the decrease in the intensity of the magnetic field can be corrected quickly and effectively without requiring any cumbersome operation. This is because the decrease of the magnetic field intensity resulting from the decrease in the current of the superconductive magnet coil 46 is detected by the magnetic field intensity error detector 82 and the defocusing of the electron beam can be readily and correctly compensated for by varying the intensity of the mask-to-sample electric field by the control signal 92 from the microprocessor 90.

FIG. 3 illustrates an electron beam pattern transfer system according to another embodiment of this invention. In FIG. 3, the same reference numerals are employed to designate parts or elements corresponding to those shown in FIG. 1 and further explanation is therefore omitted. An X-ray detector is additionally provided for detecting an X-ray generated according to an electron beam which is directed onto a sample. The waveform of a detection signal from the X-ray detector varies dependent upon the amount of focusing of the electron beam which is directed onto the sample. The proper focusing of the electron beam onto the sample can be effected by adjusting a mask-to-sample electric or magnetic field on the basis of the detection signal waveform data.

As shown in FIG. 3, a photoelectric transducing mask 100 is disposed in a vacuum container 10. The mask 100 is comprised of, like the mask 20 of FIG. 1, a quartz substrate 102, mask pattern layer 104 and photoelectric layer 106. The mask 100 has a special mask pattern 104' around the marginal edge area ($P_1$, $P_2$) of the substrate 102 which pattern serves as an alignment mask pattern. The mask pattern 104' is different in its function from the mask pattern layer 104 corresponding to a circuit pattern to be transferred later onto a substrate or sample 110 and is adapted to generate and alignment electron beam to be used only for positional alignment between the mask 100 and the sample 110. A mechanical shutter 108 is provided between a light source 16 and a transparent plate 14 attached to a top window 12 of the vacuum container 10, so as to control the passage of an ultraviolet ray radiated from the light source 16. When alignment is to be made between the mask and the sample, the shutter 108 closes the top window of the container except for openings 109a and 109b as shown in FIG. 3 to permit the ultraviolet ray to be directed onto that area of the mask pattern 104' for positional alignment. During the period in which a circuit pattern is transferred to the sample 110, the shutter 108 is driven by a driver (not shown), causing it to be substantially fully opened to permit the ultraviolet ray to be directed to the whole area of the mask 100.

The sample 110 is placed on a table structure 112 in the vacuum container 10. The sample 110 comprises a monocrystalline silicon substrate of wafer 114 and an electron sensitive resist film 116 such as PMMA is deposited on the wafer 114. Electron beam detection marks 118a and 118b for alignment are additionally provided on the marginal edge areas $P_1$ and $P_2$ of the silicon substrate 114 of the sample 110, respectively. The detection marks 118a and 118b have a pattern configuration corresponding to the mask patterns 104' formed on the marginal edge areas $P_1$ and $P_2$ of the mask 100, respectively. Each of the detection marks 118 and 118b, is adapted to generate an X-ray according to an amount of electron beam illuminated and is made of a heavy metal, such as molybdenum or tantalum, which provides a better X-ray generation contrast characteristic between the mark 118 and the surface of the sample. As is known in the art, the intensity of the X-ray which is generated from the metal depends upon the atomic number of the metal used as the mark. The intensity of, for example, a continuous X-ray is increased substantially proportional to the atomic number of the metal. In this embodiment, tantalum (Ta) is preferably selected as the heavy metal for the marks 118a and 118b.

Where the ultraviolet source is to be radiated onto the areas $P_1$ and $P_2$ of the mask 100 by the action of the shutter 108, an electron beam for alignment which is indicated by 120 in FIG. 3 is generated therefrom. The electron beam 120 is introduced from the mask 100 onto the corresponding marginal edge area of the sample 110.

The table structure 112 includes a supporting body 122 which has two openings 124a and 124b corresponding to the marginal edge areas $P_1$ and $P_2$ of the mask 100 or the detection marks 118a and 118b of the sample 110.

Two X-ray detectors 126a and 126b are housed in the openings 124a and 124b, respectively, and adapted to detect an X-ray which is generated from the masks 118a and 118b of the sample 110 due to the illumination of the mask 100 with the ultraviolet ray. A base 128 of the supporting body 122 is rotatable through a desired angle in an X-Y plane by a table rotation driver 130, permitting the sample 110 on the supporting body 122 to be rotated a necessary amount. It should be noted that reference numeral 132 denotes an X- and Y-deflection coil for deflecting an electron beam in the X- and Y-directions. Detection signals 134a and 134b generated from the detectors 126a and 126b are supplied to signal amplifiers 136a and 136b, respectively, of, for example, a photomultiplier. The outputs of the amplifiers 136a and 136b are connected respectively through lock-in amplifiers 138a and 138b to a control section or microprocessor 142. Each of the lock-in amplifiers 138a and 138b detects the envelope waveform of the detection signal 134, followed by a differential amplification (a lock-in detection amplification).

The control section comprised of the microprocessor 142 supplies control signals 144, 145 and 146 to the table rotation driver 130, deflection coil 132 and DC voltage generator 44 in response to output signals 140a and 140b from the lock-in amplifiers 138a and 138b.

The operation of the electron beam pattern transfer system will now be explained. When the shutter 108 closes the top window 12 of the container 10, except for the openings 109a and 109b, an ultraviolet ray is directed from the light source 16 onto just the two marginal edge areas $P_1$ and $P_2$ of the mask 100, producing a photoelectrically transduced electron beam 120 from the mask 100 which electron beam corresponds to the mask pattern 104' for alignment. The electron beam is accelerated by a magnetic and electric fields created by a superconductive magnet 46 and DC voltage generator 44, and introduced into the detection marks 118a and 118b of the sample 110. The accelerated electron beam, while being deflected in the X- and/or Y-direction by the deflection coil 132, bombards the heavy metal area of the detection marks 118a and 118b of the sample 110. As a result, the marks 118a and 118b generate an X-ray as set out above. The X-ray enters through the silicon wafer 114 of the sample 110 into the X-ray detectors 126a and 126b held in the table structure 112. The X-ray detectors 126a and 126b produce the detection signals 134a and 134b according to the intensity of the incident X-ray.

Generally, when a beam-illuminated area on the heavy metal layer of each of the detection marks, 118 and 118b, becomes maximal by the X- and Y-direction deflections, i.e., when the mask patterns 104, of the mask 100 properly align with the detection marks 118 of the sample 110, a maximal intensity of X-ray is obtained.

Figure 4A:
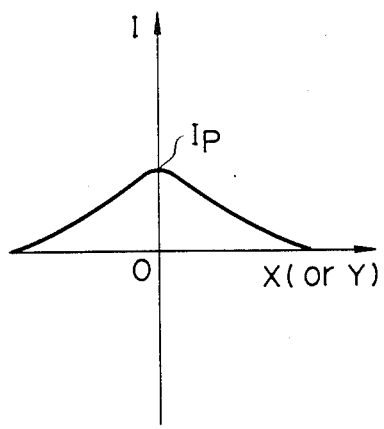
FIG. 4A is a graph showing a variation of a detection signal output from the X-ray detector of the system of FIG. 3, with respect to the deflection of an electron beam in an X or Y direction.
Figure 4B:
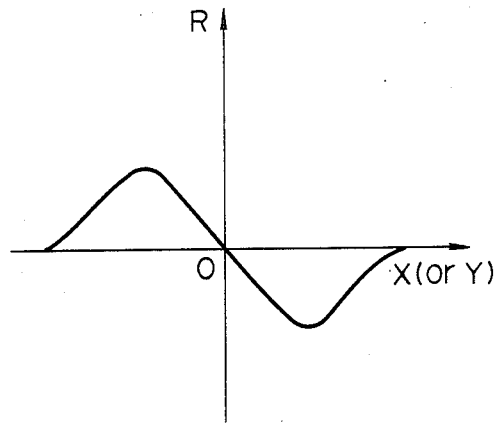
FIG. 4B is a graph showing a waveform of an output signal from a lock-in amplifier of FIG. 3, the waveform corresponding to a differentiation waveform of FIG. 4A.
Figure 5A:
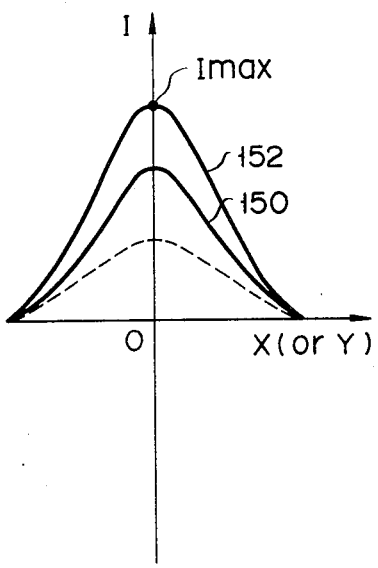
FIGS. 5A and 5B are graphs showing the degree with which the electron beam is focused on a workpiece, the graphs corresponding to the waveforms of FIGS. 4A and 4B.
Figure 5B:
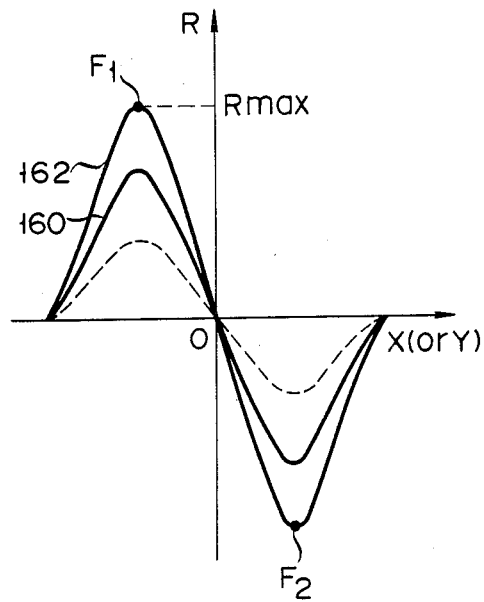

As illustrated in FIG. 4A, the level intensity I of the detection signal 134 from the X-ray detector 126 varies, in a quadratic curve, dependent upon the mask pattern-to-sample displacement ΔdX (or ΔdY) in the X- or Y-direction. The level intensity I of the detection signal 134 has a peak value $I_p$ as indicated by $I_p$ in FIG. 4A, when a best alignment between the mask and the sample is obtained in the X- and Y-directions. The detection signal having such characteristic is amplified by the lock-in amplifier 138 to deliver a signal 140 having a substantially differentiated waveform as shown in FIG. 4B. When in the waveform of FIG. 4B the detection signal level I has a peak value Ip, the sign of a rate of change (inclination) R (=dI/dX or dI/dX) of the detection signal envelope waveform is inverted to permit a zero point crossing. The microprocessor 142 controls the deflection coil 132 in response to the signal 140 so as to permit the photoelectron beam directed from the mask 100 to the sample 110 to obtain an optimal magnetic deflection in the X- and Y-directions. The rotational displacement ΔQ of the sample 110 is corrected by rotating the table structure 112 by the table rotation driver 130 under the control of the microprocessor 142.

Where the sample 110 is displaced from a predetermined reference position and thus the mask-to-sample distance d involves an erroneous difference Δd, the photoelectron beam 120 is not properly focused onto the sample 110, causing the blur of the beam spot. Where the electron beam is poorly focused onto the surface of the sample or the mask-to-sample distance exceeds the depth of focusing of the electron beam, a lower beam intensity results on the sample 10. Under this condition, the control section 140 controls the DC voltage generator 44 so as to vary the mask-to-sample field effect intensity. When the degree of focusing of the photoelectron beam 120 is improved according to the change of the electric field, the beam intensity I on the sample is increased as indicated by 150, 152 in FIG. 5A and a maximum peak value $I_{max}$ is obtained at the peak of the waveform in FIG. 5A. The output signals 140a and 140b from the lock-in amplifiers 138a and 138b vary as indicated by 160, 162 in FIG. 5B. When one (for example, F1) of two points $F_1$ and $F_2$ of inflection corresponding to maximal and minimal values on the waveform of the signal 140 coincides with a minimum peak value $R_{max}$, the control section 140 decides that a best beam focusing is obtained, and sets the voltage value of the DC voltage generator to a value at that time. Thereafter, the shutter 108 is fully opened and a main step of pattern transfer can be started under the optimal condition.

With this embodiment, such automatic focus-correcting mechanism is provided which adjusts the focusing of the electron beam onto the sample or workpiece 110 by utilizing the phenomenon that the detection signal waveform from the X-ray detector varies according to an amount of beam defocus on the sample 110. It is therefore unnecessary to precisely set the mask-to-sample distance. It is also unnecessary to perform any cumbersome operation, such as the measurement of the mask-to-sample distance and measurement of the actual magnetic field. Even if the position of the sample is displaced beyond the depth of focusing, an automatic beam focusing adjustment can be made, obviating the necessity of positioning the sample for vertical alignment. Even under the varying transfer conditions, the beam focusing adjustment can be readily performed without finding the corresponding focusing conditions. It is therefore possible to shorten the necessary setup time. For example, even under the varying transfer conditions a rapid beam focusing adjustment can be made without lowering the productivity.

Although this invention has been shown and described with respect to the particular embodiment, various changes and modifications are possible to those skilled in the art without departing from the spirit and scope of this invention.

For example, a laser interferometer may be used as a means for detecting a distance between the mask and the sample. Similarly, the magnetic field detector is not restricted to the Hall element. Any means may be used instead if it can detect the intensity of a magnetic field between the mask and the sample.

According to the embodiment shown in FIG. 3, the degree of beam focusing is detected by the X-ray from the mark 118 on the workpiece 110, a similar mark, however, may be provided on a sample supporting member (sample supporting base) or a pattern having a restricted area illuminated with the photoelectron beam may be provided on the sample or the supporting member. The pattern or mark may be a photoelectron beam responding means that emits a charged particle ray, such as a radiation ray or an electron beam.

Furthermore, in the above-mentioned embodiment the photoelectron beam is deflected in the X- and Y-directions by the X- and Y-deflection coil 132 to obtain an alignment signal and photoelectron beam intensity signal. However, it is also set in the X- and Y-directions by the same deflection coil, the same functions can be performed by separate deflection coils.

What is claimed is:

1. An apparatus for transferring a desired fine pattern onto a target body, such as a substrate having a resist film, by the use of electron beams, comprising:
   container means for defining a transfer chamber which is evacuated to a predetermined vacuum level;
   photoelectrical transducing mask means provided in the transfer chamber and arranged in a spaced apart relation to the substrate, having a pattern to be transferred onto the resist film of the substrate and adapted to receive light to permit a photoelectron beam pattern corresponding to the pattern of the mask means to be emitted onto the resist film;
   table means movably provided in the transfer chamber to support the substrate thereon;
   magnetic field generating means positioned around said container means, for generating a magnetic field of a predetermined intensity in a space between the substrate and the mask means in said transfer chamber;
   voltage generator means provided outside said container means, for applying a DC voltage between the substrate and the mask means to create an electric field therebetween;
   defocus detector means for, when an electron beam pattern image is formed on the resist film of the substrate, automatically detecting the defocusing of the photoelectron beam pattern on the substrate and for producing a detection signal; and
   focusing controller means, connected to said voltage generator means and said defocus detector means, for controlling, in response to the detection signal, said voltage generator means so as to vary the apolied DC voltage and vary the electric field according to the amount of detected defocusing, thereby compensating for said amount of defocusing.

2. An apparatus according to claim 1, wherein said defocus detector means comprises:

distance measuring means for measuring an actual distance between the mask means and the substrate and for detecting a difference between the measured distance and a predetermined reference distance to produce an electrical detection signal corresponding to said difference.

3. An apparatus according to claim 2, wherein said focusing controller means comprises:

voltage level adjusting means, connected to said distance measuring means and said voltage generator means, for causing said voltage generator means to vary the DC voltage applied between the mask means and the substrate in response to the electrical detection signal so as to compensate for the amount of defocusing of the pattern image produced due to a difference in distance between the mask means and the substrate.

4. An apparatus according to claim 1, wherein said defocus detector means comprises:

magnetic field measuring means for measuring an actual intensity of the magnetic field generated between the mask means and the substrate, and for detecting the difference between the measured field intensity and a predetermined reference magnetic field intensity to produce an electrical detection signal corresponding to said difference.

5. An apparatus according to claim 4, wherein said focusing controller means comprises:

voltage level adjusting means, connected to said magnetic field measuring means and said voltage generator means, for causing said voltage generator means to vary the DC voltage applied between the mask means and the substrate in response to the electrical detection signal so as to compensate for the amount of defocusing of the pattern image produced due to a difference between said measured field intensity and the predetermined reference magnetic field intensity.

6. An apparatus accordinc to claim 4, in which said magnetic field generating means includes a superconductive magnet adapted to be operated in a essentially permanent current mode to create an essentially constant magnetic field between the mask means and the substrate.

7. An apparatus according to claim 6, in which said magnetic field measuring means is adapted to measure a decrease in the intensity of a magnetic field created between the mask means and the substrate which occurs due to the aging of said superconductive magnet.

8. An apparatus according to claim 1, wherein said defocus detector means comprises:

distance measuring means for measuring an actual distance between the mask means and the substrate and for detecting a difference between the measured distance and a predetermined reference distance to produce a first electrical detection signal corresponding to said difference; and magnetic field measuring means for measuring an actual intensity of the magnetic field generated between the mask means and the substrate, and for detecting the difference between the measured magnetic field intensity and a predetermined reference magnetic field intensity to produce a second electrical detection signal corresponding to said difference.

9. An apparatus according to claim 8, wherein said focusing controller means comprises:

voltage level adjusting means, connected to said distance measuring means, said magnetic field measuring means and said voltage generator means, for causing said voltage generator means to vary the DC voltage applied between the mask means and the substrate in response to said first and second detection signals to as to compensate for the amount of defocusing of the pattern image produced due to a difference in distance between the mask means and the substrate and due to a change in magnetic field.

10. An apparatus according to claim 7, wherein said defocus detector means comprises:

distance measuring means for measuring an actual distance between the mask means and the substrate and for detecting a difference between the measured distance and a predetermined reference distance to produce an electrical detection signal corresponding to said difference.

11. An apparatus according to claim 10, wherein said focusing controller means comprises:

voltage level adjusting means, connected to said distance measuring means, said magnetic field measuring means and said voltage generator means, for causing said voltage generator means to vary the DC voltage apolied between the mask means and the substrate in response to said first and second detection signals so as to compensate for the amount of defocusing of the pattern image produced due to a difference in distance between the mask means and the substrate and due to a change in magnetic field.

12. An apparatus according to claim 1, wherein said defocus detector means comprises:

X-ray generating means for generating an X-ray according to the photoelectron beam pattern directed from the mask means onto said substrate, the amount of X-ray generated varying dependent upon the extend of focusing of the photoelectron beam onto the substrate; and X-ray detector means for receiving the X-ray from said X-ray generator means to produce the electrical detection signal respresenting the detected amount of X-ray, and for detecting the amount of defocusing of the pattern image based upon a rate of change of a differentiated waveform of the detection signal.

13. An apparatus according to claim 12, wherein said focusing controller means comprises:

voltage level adjusting means, connected to said X-ray detector means and said voltage generator means, for causing said voltage generator means to vary the DC voltage applied between the mask means and the substrate so as to permit correction of the amount of defocusing of the pattern image.

14. An apparatus according to claim 13, wherein said X-ray detector means comprises:

lock-in amplifier means, connected to said X-rays generating means, for detecting an envelope waveform of the detection signal and for differentiating the envelope waveform to produce a modified detection signal having a substantially differentiated waveform; and microprocessor means, connected to said lock-in amplifier means and said voltage generator means, for causing said voltage generator means to vary the DC voltage applied between the mask means and the substrate in response to the modified detection signal so as to compensate for the amount of defocusing of the pattern image, which is detected when the rate of change of the differentiated waveform of said modified detection signal is maximum.

15. An apparatus according to claim 14, in which said X-ray generating means is initially provided on the substrate.

16. An apparatus according to claim 13, wherein said X-ray detector means is provided within said table means to effectively receive the X-ray.

17. An apparatus according to claim 16, in which said X-ray generating means includes mark layer means for generating the X-ray, said mark layer means being initially formed on the marginal edge area of the substrate, being made of metal for generating an X-ray according to an amount of photoelectron beam incident on the metal, and having a predetermined pattern.

18. An apparatus according to claim 17, in which said mask means has a mask pattern layer means formed on the marginal edge area of the mask means and exposed with an ultraviolet ray before a fine pattern is transferred to the mask means, whereby when a best alignment is made between the mask means and the substrate and at the same time the photoelectron beam directed from the mask pattern layer means to the mark layer means involves a least amount of defocusing with respect to the substrate, said mark layer means generates a maximum intensity X-ray.

* * * * *